United States Patent [19]

Skrovanek et al.

[11] 4,438,408
[45] Mar. 20, 1984

[54] SIGNAL ATTENUATING APPARATUS

[75] Inventors: Ambroz K. Skrovanek, Bethesda, Md.; Carl A. Evert, Alexandria, Va.

[73] Assignee: Harvey Hubbell Incorporated, Orange, Conn.

[21] Appl. No.: 408,900

[22] Filed: Aug. 17, 1982

[51] Int. Cl.³ .......................... H03G 1/00; H03H 7/24
[52] U.S. Cl. ...................... 330/51; 330/110; 330/284; 333/81 R
[58] Field of Search ............... 333/81 R; 330/51, 278, 330/110, 85, 86, 284, 282; 323/282, 293, 234, 354, 280; 307/264, 359

[56] References Cited

U.S. PATENT DOCUMENTS

| 3,729,687 | 4/1973 | Orlandini et al. | 330/51 |
| 3,806,824 | 4/1974 | Storzbach | 330/86 X |
| 3,810,035 | 5/1974 | Gundry | 330/86 |
| 4,132,957 | 1/1979 | Hekimian et al. | 330/51 |
| 4,209,753 | 6/1980 | Riley | 330/51 |
| 4,354,159 | 10/1982 | Schorr et al. | 333/81 R X |

Primary Examiner—Paul L. Gensler
Assistant Examiner—Benny Lee
Attorney, Agent, or Firm—Jerry M. Presson

[57] ABSTRACT

Disclosed is an apparatus having a signal attenuating portion for setting the gain or loss in amplitude of an electrical signal received by the apparatus, and alternatively, provides a gain of unity without a change of setting. The apparatus employs a plurality of switching devices which may be selectively opened and closed to provide the apparatus with a fixed gain of unity and alternatively predetermined losses or gains to the input signals.

9 Claims, 4 Drawing Figures

SIGNAL ATTENUATING APPARATUS

TECHNICAL FIELD

This invention relates to an electrical signal attenuating apparatus, and more particularly, to a signal attenuating circuit for providing increases or reductions in data and telecommunication signal levels.

BACKGROUND ART

In two and four-wire data and telecommunications networks, various types of attenuating devices in modular form are conventionally used to control signal amplitude levels as the signal feeds through the network. The device is usually designed to be adjustable to provide variable attenuation or gain adjustment because the loss in signal amplitude typically depends upon the length of the electrical conductor or cable to which the device is connected. The lengths of such lines may vary from one installation to another. In addition, the impedance of the line which causes signal loss may vary depending upon the particular condition of the line transmitting the signals.

A variety of conventional signal attenuating devices of an analog-type are used to effect the necessary changes in the amplitude of the signal. Such devices include single turn and multiple turn variable resistors or potentiometers embodying one or more precision resistors which can be tapped off by movement of a linear slider or rotary wiper arm to apply more or less resistance to the circuit, thereby correspondingly varying the signal loss or gain. For use in data and telecommunications circuits, the variable resistor is typically designed to apply up to 16 decibels of loss to the signal in the circuit.

More recently, the trend in the art is to provide level adjustment by means of incrementally controlled switches which adjust the gain or loss in a digital manner using some binary-based numerical sequence to provide the desired decibel range and resolution.

For data and telecommunications circuit applications, the attenuator should provide the desired signal attenuation with the requisite resolution. Preferably, the attenuator should also have the capability of providing an output signal which is exactly equal to the input to which the attenuator is connected. Thus, if the attenuator can be set to provide a gain of unity to signals from any data or telecommunications circuit to which the attenuator is connected by monitoring the output of the attenuator, the level of the signal inputted to the attenuator can be extrapolated because it is essentially an exact replica of the output signal. This allows an installer coupling into a telecommunications circuit of unknown characteristics to determine, by simply measuring the output signal level of the attenuator, if the signal output of the circuit to which the attenuator is connected is at a particular level. This feature is especially important if it is difficult to obtain direct access to the internal terminals of the circuit to monitor the levels of the signals transmitted by such circuit. This capability is also important to provide precise alignment in signal levels between the signals of the two circuits respectively coupled to the input and output terminals of the attenuator circuit.

OBJECTS OF THE INVENTION

It is an object of this invention to provide a new and improved apparatus for providing a predetermined gain or loss to an electrical signal.

Another object of this invention is an improved attenuating circuit for telecommunication and data signals which provide different levels of gains and losses to electrical signals received thereby and alignment in signal levels between those circuits respectively, coupled to the input and output of the attenuating circuit.

Another object of this invention is to provide an attenuator circuit for selectively providing a gain of unity to signals received thereby without changing the setting of the attenuator.

BRIEF DESCRIPTION OF THE INVENTION

In accordance with this invention, there is provided an apparatus including a signal attenuating portion for setting the gain or loss in amplitude of an electrical signal received by the apparatus, and alternatively, provides a gain of unity without changing the setting of the attenuating portion of the apparatus. The apparatus employs a plurality of switching devices which may be selectively opened and closed to provide the apparatus with a fixed gain of unity and alternatively, losses or gains to the input signals as determined by the setting of the attenuating portion.

DETAILED DESCRIPTION OF THE INVENTION

Figure 1A:
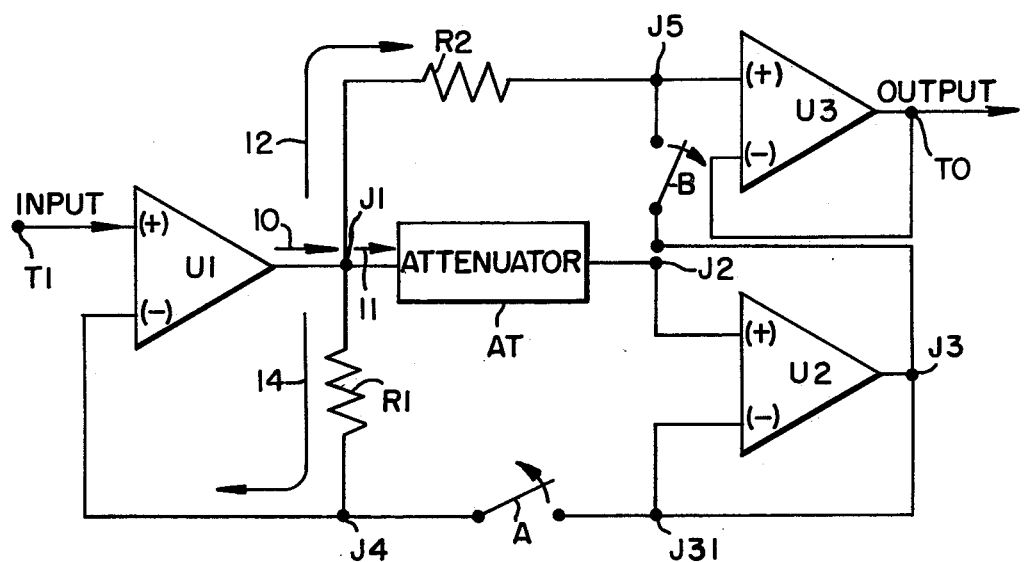
FIG. 1A is an electrical schematic drawing of the attenuator apparatus constructed in accordance with this invention, depicting the apparatus in a mode which provides a unity gain between the input and output terminals of the apparatus.

Referring to FIG. 1A, the apparatus constructed in accordance with this invention comprises three amplifiers U1, U2 and U3, each of such amplifiers having an output terminal and dual input terminals indicated respectively by the polarity signs (+) and (−) corresponding to the signal noninverting and signal inverting terminals, respectively. The amplifier U1 comprises the input amplifier receiving the input electrical signal at its noninverting (+) terminal T1 and produces an output signal 10, and the amplifier U3 comprises the output amplifier for producing the desired output signal level at its output terminal T0. Each of the amplifiers U1, U2 and U3 has a negative feedback circuit coupling its output terminal to its signal inverting (−) input terminal which causes the amplifiers to operate with a gain of unity. The amplifiers U1, U2 and U3 are typically dual-input, solid-state amplifiers each having the parameters of an operational amplifier characterized by a very high input impedance and a very low output impedance; the amplifiers U2 and U3 being connected in the apparatus in a voltage-follower configuration.

The input signals received by the apparatus is typically a voice or data electrical signal derived from a telephone or data communications circuit, not shown. Such signals may range in amplitude or level from −30 to +10 dB in increments of 0.1 to 0.5 dB, for example, throughout their range and thus these are typical design requirements for applications of the instant invention.

The apparatus also comprises an attenuator AT which has its input terminal connected to a junction J1 which is common to the output terminal of the amplifier U1 and the noninverting terminal J5 of the amplifier U3; the J5 terminal being connected to the J1 junction through a voltage-dropping resistor R2 of typically 10 K ohm value. The attenuator AT may be a conventional variable resistor embodying a plurality of resistors of which appropriate resistance values which can be inserted into or removed from the circuit between junctions J1 and the junction J2 by, for example, rotation or longitudinal movement of a slider element. Alternatively, the resistors of the attenuator may be automatically connected in the circuit by selective switch closures and openings effected by control circuits, as is known to those skilled in the art.

Resistor R1, also of typically 10 K ohm value, connects the amplifier U1 output terminal J1 to a junction J4 which, in turn, is connected to the inverting (−) input terminal of the amplifier U1. Output terminal J2 of the attenuator AT receives the attenuated signals which are produced by the attenuator and is connected to the noninverting (+) input terminal of the amplifier U2. The output of the amplifier U2 is fed back to its inverting (−) input terminal J31 to provide unity gain to signals received at the terminals J3 and J31 hence, to signals fed back from the output terminal J2 of the attenuator AT to the signal inverting (−) input terminal of the input amplifier U1. The output resistance of the amplifier U2 is approximately 1 ohm to overcome any signal contribution from the resistor R1 of much higher resistance value. The output terminal J3 of amplifier U2 is selectively connected to the junction J5 by operation of a switching device B.

Each of the switching devices A and B may be of a manual, single pole, single throw type or of a solid state type, such as a CMOS analog or FET gate. The switch A selectively feeds the attenuated output signals 15 from the attenuator AT output terminal J2 through the amplifier U2 with little resistance to the inverting (−) input terminal of the amplifier U1. When the switch A is closed, the negative feedback circuit is completed and when the switch A is opened, the negative feedback circuit is interrupted. In the latter case, the resistor R1 feeds a signal 14 from the amplifier U1 output terminal J1 through the resistor R1 to the inverting (−) input terminal. In this mode, and assuming the switch B is also open (as illustrated in FIG. 1A), the amplifier U1 provides a unity gain to the voice or data signal received at its noninverting signal input terminal T1. Thus, with the switches A and B open, the junction J5 receives an output signal 12 which is identical to the input signal and the output amplifier U3 produces output signals at the terminal T0 which are essentially identical in polarity and amplitude to the signal 10. This result maintains even though the attenuator AT may be setting at some particular attenuation level because the attenuator output is not fed to the input terminal J5. Also, even if access to the input terminal T1 is not available to one using the instant apparatus, by merely measuring the output at the terminal T0, the user can verify the amplitudes or levels of the input signals received by the input terminal T1 from the circuits connected as inputs to the terminal T1. Hence, alignment is achieved between respective circuits connected to the input and the output terminals T1 and T0, respectively, of the instant apparatus.

Figure 1B:
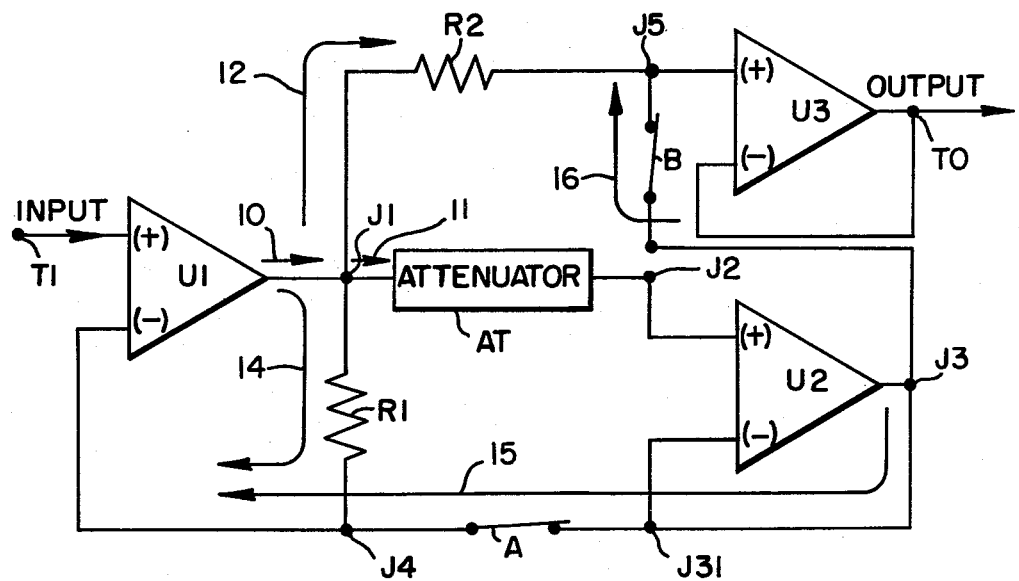
FIG. 1B is an electrical schematic drawing depicting another unity gain mode of operation of the apparatus shown in FIG. 1A.

FIG. 1B depicts another arrangement of switches A and B which provide unity gain to the apparatus. In this mode, the switches A and B are closed. The signal feedback from the attenuator output J2 is indicated by the arrow 15 and is applied to the inverting input terminal of the amplifier U1. Since the attenuating signal is applied to the inverting input terminal of the amplifier U1, the output of the amplifier U1 is increased proportionately to the loss which is given to the signal by the attenuator AT. The negative feedback signal fed through the resistor R1, as indicated by the arrow 14, is negligible compared to the feedback current 15 since the resistance offered by the resistor R1 to the signal 14 is much greater than the resistance offered to the signal 15 by the U2 feedback circuit. Thus, the output signal 12 of the amplifier U1 which flows through the resistor R2 has its net gain increased by the amount of the net loss in the signal 15 which is fed back to the amplifier U1 inverting (−) input terminal. However, the amplifier U2 also feeds junction J5 through closed switch B and has a low output impedance compared to the resistance of the resistor R2. Hence, the voltage at J5 is equal to the output voltage at the junction J3 and this voltage is exactly equal to the input voltage at terminal T1. Consequently, the overall gain of the circuit is once again unity, and accordingly, with both of the switches A and B in either a closed or opened state, the instant apparatus will provide no net gain or loss in transmitted signals.

Figure 1C:
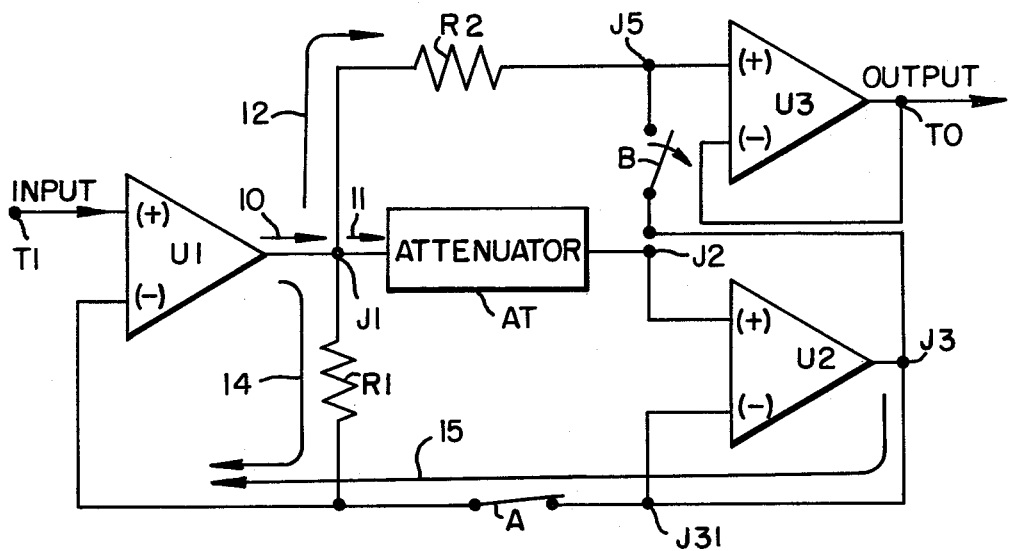
FIG. 1C is another schematic drawing of the apparatus shown in FIG. 1A depicting the apparatus in a mode for providing signal gain.

To provide a gain in the signal transmission, the switch A is closed and the switch B is opened, as depicted by FIG. 1C. Under these conditions, the attenuated output signal at the junction J3 is supplied as a feedback signal 15 through the closed switch A to the inverting (−) input terminal of the amplifier U1 causing the amplifier to have a gain D. Since the switch B is open, the attenuated output of the attenuator AT is not received by the junction J5 and as a result, the signal which flows through the resistor R2 has the gain of the U1 amplifier, which is a function of the particular setting of the attenuator AT. The signal gain appears at the output terminal T0 of the amplifier U3 and can be increased in dB value by appropriate adjustment of the attenuator AT.

Figure 1D:
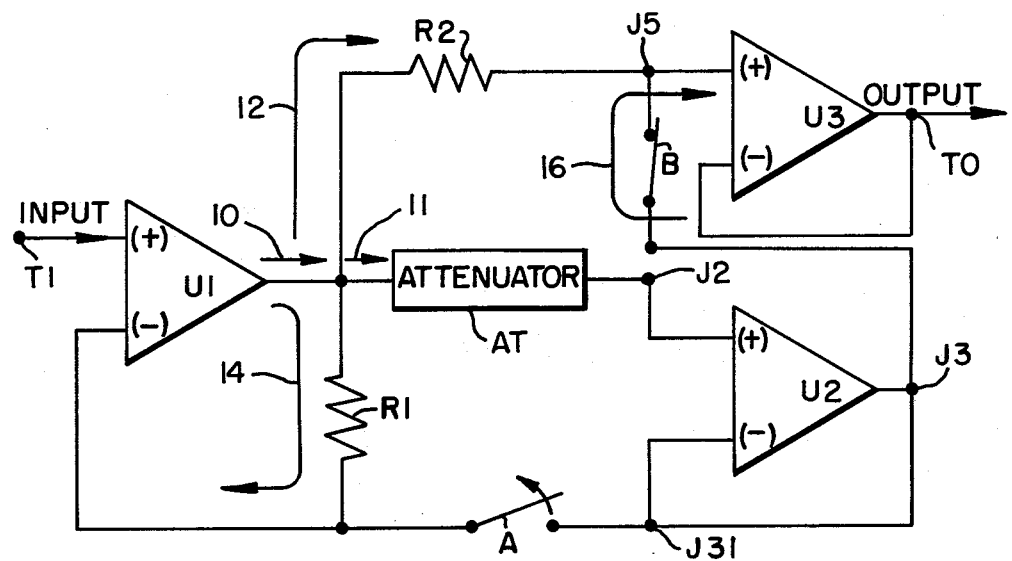
FIG. 1D is another schematic of the apparatus shown in FIG. 1A depicting the apparatus in a mode which provides a loss in signal amplitude.

To provide a loss in the signal transmission, the switch A is opened, thereby disabling the attenuator feedback to the input amplifier U1 and the switch B is closed so as to apply only the attenuated signal to the terminal J5 as depicted by FIG. 1D. The input signal applied to the terminal T1 of amplifier U1 is attenuated to the desired extent by the setting of the attenuator AT. The amplitude of the signal which flows through the resistor R2 from the amplifier U1 is negligible in comparison to that of the signal produced at the junction J5 by the amplifier U2 because the former signal is attenuated to a much greater extent by the much greater (10 K times) resistance of the resistor R2. As a result, the attenuated signal appears at the output terminal T0 of the apparatus.

In summary, the instant invention provides unity signal gain when both switches A and B are closed or both are open as shown by FIGS. 1A and 1B, respectively. A gain of signal amplitude proportional to the setting of the attenuator AT is provided with the switch A closed and the switch B opened, as depicted in FIG. 1C. A decrease of signal amplitude proportional to the setting of the attenuator AT results when the switch A is open and the switch B is closed, as depicted by FIG. 1D of the drawings. It will be noted that the inadvertent opening or closing of both switches A and B merely results in the apparatus providing a unity gain to the input signal rather than inadvertent gain or loss in signal power which could have more serious consequences in data transmission and telephone circuits coupled to the instant circuit and the mere fact that the circuit will provide precise unity gain for signal transmissions is advantageous, for reasons discussed hereinabove.

While one advantageous embodiment has been chosen to illustrate the instant invention, it will be understood by those skilled in the art that various changes and modifications can be made therein without departing from the scope of the invention as defined in the appended claims.

We claim:

1. Apparatus for providing a predetermined gain or loss to electrical signals, comprising:
signal attenuating means including an input terminal and an output terminal for attenuating the electrical signals received at the input terminal thereof and providing the attenuated electrical signals at the output terminal thereof,
a feedback circuit coupling the attenuating means output terminal to the attenuator input terminal and including a first switching device for selectively feeding back the attenuated signal to said attenuator input,
output circuit means having an input and an output for producing output signals at the output thereof having amplitudes which are functions of the attenuation provided by said attenuating means,
first circuit means connected in parallel with said attenuating means for coupling said attenuating means input terminal to the input of said output circuit means,
a second switching device selectively connecting said attenuating means output to the input of said output circuit means, whereby said output circuit means selectively feeds the attenuated electrical signal produced by said attenuating means to said input of said output circuit means,
each of said first and second switching devices having an open and a closed state and being operative such that the apparatus provides a gain or loss in amplitude of the electrical signals received thereby.

2. The apparatus according to claim 1 and further comprising:
an input amplifier having signal inverting and noninverting terminals and an output terminal coupled to said input terminal of said attenuating means,
the noninverting amplifier input terminal receiving the electrical signals fed to the apparatus, and wherein the inverting amplifier input terminal is connected to said feedback circuit for receiving attenuated signals from said attenuating means output terminal, whereby the gain provided by said input amplifier is inversely proportional to the attenuation provided by said attenuating means.

3. The apparatus as claimed in claim 2 wherein said input amplifier includes a feedback circuit connecting the output and inverting input terminals thereof.

4. The apparatus according to claim 3 wherein said feedback circuit of said input amplifier includes a resistor of resistance value substantially greater than the resistance of said feedback circuit connecting the output of said attenuating means to said inverting input of said input amplifier with said first switching device in a closed state.

5. The apparatus as claimed in claims 2 or 4 wherein said first circuit means includes an impedance of much greater resistance value than the electrical resistance in said feedback circuit with said first switching device in a closed state.

6. The apparatus according to claim 5 wherein said output circuit means comprises an amplifier having a signal noninverting input terminal connected to said second switching device and said first circuit means.

7. The apparatus according to claim 6 wherein said output amplifier provides substantially unity gain to signals received at the noninverting input terminal thereof.

8. The apparatus according to claim 5 wherein said impedance is a resistor series-connecting said attenuating means input terminal to said noninverting input terminal of said output amplifier.

9. The apparatus according to claim 8 and further comprising, a second amplifier of substantially unity gain connected in said feedback circuit and having an output selectively connected to said noninverting input terminal of said output amplifier by means of said second switching device.

* * * * *